(12) United States Patent
Kuo et al.

(10) Patent No.: US 9,406,400 B2
(45) Date of Patent: Aug. 2, 2016

(54) GATE DRIVING CIRCUIT

(71) Applicant: Chunghwa Picture Tubes, Ltd., Taoyuan (TW)

(72) Inventors: Chih-Yu Kuo, New Taipei (TW); Yu-Fan Hu, Kaohsiung (TW)

(73) Assignee: Chunghwa Picture Tubes, Ltd., Longtan Dist., Taoyuan (TW)

( * ) Notice: Subject to any disclaimer, the term of this patent is extended or adjusted under 35 U.S.C. 154(b) by 101 days.

(21) Appl. No.: 14/287,066

(22) Filed: May 26, 2014

(65) Prior Publication Data

US 2015/0255172 A1   Sep. 10, 2015

(30) Foreign Application Priority Data

Mar. 10, 2014 (TW) .............................. 103108251 A

(51) Int. Cl.
| | |
|---|---|
| *H03K 19/00* | (2006.01) |
| *G11C 19/28* | (2006.01) |
| *H03K 3/012* | (2006.01) |
| *H03K 3/356* | (2006.01) |

(52) U.S. Cl.
CPC .............. *G11C 19/287* (2013.01); *H03K 3/012* (2013.01); *H03K 3/356026* (2013.01)

(58) Field of Classification Search
CPC ................. G11C 19/28; G11C 19/287; G09G 2310/0286; G09G 3/3677
USPC .................................................. 327/108–112
See application file for complete search history.

(56) References Cited

U.S. PATENT DOCUMENTS

| | | |
|---|---|---|
| 6,313,664 B1 | 11/2001 | Hall |
| 8,098,792 B2 | 1/2012 | Hsu |
| 8,160,198 B2 | 4/2012 | Tsai |
| 8,269,712 B2 | 9/2012 | Shih |

(Continued)

FOREIGN PATENT DOCUMENTS

| | | |
|---|---|---|
| CN | 1881474 A | 12/2006 |
| CN | 103295511 A | 9/2013 |
| TW | 201327542 A1 | 7/2013 |

OTHER PUBLICATIONS

Yiming Li; Kuo-Fu Lee; I-Hsiu Lo; Chien-Hshueh Chiang; Kuen-Yu Huang, "Dynamic Characteristic Optimization of 14 a-Si:H TFTs Gate Driver Circuit Using Evolutionary Methodology for Display Panel Manufacturing", Journal of Display Technology, vol. 7, No. 5, pp. 274-280, May 2011.

(Continued)

*Primary Examiner* — Lincoln Donovan
*Assistant Examiner* — Diana J Cheng
(74) *Attorney, Agent, or Firm* — Winston Hsu; Scott Margo

(57) ABSTRACT

An Nth stage shift register of a gate driving circuit includes a pull-up unit for pulling up an Nth stage gate signal of a gate line to a high level voltage according to a driving voltage and a first clock signal; an energy-store unit for providing the driving voltage to the pull-up unit; a driving unit for charging the energy-store unit according to a previous stage gate signal; a pull-down unit for pulling down the driving voltage and the Nth stage gate signal to a low level voltage according to a control signal; and a control unit for generating the control signal according to a second clock signal and the driving voltage; wherein the first and the second clock signals have a same pulse width, and a rising edge of the first clock signal leads a rising edge of the second clock signal by ¼ to ½ pulse width.

10 Claims, 6 Drawing Sheets

(56) References Cited

U.S. PATENT DOCUMENTS

2006/0279511 A1    12/2006   Uh
2013/0169609 A1     7/2013   Son

OTHER PUBLICATIONS

Binn Kim; Hyung Nyuck Cho; Woo Seok Choi; Seung-Hee Kuk; Juhn-Suk Yoo; Soo Young Yoon; Myungchul Jun; Yong-Kee Hwang; Min-Koo Han, "A Novel Depletion-Mode a-IGZO TFT Shift Register With a Node-Shared Structure", IEEE Electron Device Letters, vol. 33, No. 7, pp. 1003-1005, Jul. 2012.

Di Geng; Kang, D.H.; Man Ju Seok; Mativenga, M.; Jin Jang, "High-Speed and Low-Voltage-Driven Shift Register With Self-Aligned Coplanar a-IGZO TFTs", IEEE Electron Device Letters, vol. 33, No. 7, pp. 1012-1014, Jul. 2012.

Chih-Lung Lin; Chun-Da Tu; Chia-En Wu; Chia-Che Hung; Kwang-Jow Gan; Kuan-Wen Chou, "Low-Power Gate Driver Circuit for TFT-LCD Application", IEEE Transactions on Electron Devices, vol. 59, No. 5, pp. 1410-1415, May 2012.

Seong-Jin Ahn; Jin-Seong Kang; Hai-Jung in; Sanghyun Ju; Oh-Kyong Kwon, "A Low-Output-Noise Multistage Shift Register Using Tin Dioxide Nanowire Transistors", IEEE Electron Device Letters, vol. 33, No. 10, pp. 1411-1413, Oct. 2012.

US 9,406,400 B2

GATE DRIVING CIRCUIT

BACKGROUND OF THE INVENTION

1. Field of the Invention

The present invention relates to a gate driving circuit, and more particularly, to a gate driving circuit capable of reducing power consumption and saving space.

2. Description of the Prior Art

Generally, a display panel comprises a plurality of pixels, a gate driving circuit, and a source driving circuit. The source driving circuit is for providing a plurality of data signals to be written into turned-on pixels. The gate driving circuit comprises plural-stage shift registers for providing a plurality of gate driving signals in order to control on and off states of each row of pixels. In order to reduce cost, the gate driving circuit is directly formed on a border area of the display panel. The above display panel is a gate-in-panel type display panel. A shift register of the conventional gate-in-panel type display panel consists of seven transistors and two capacitors, which is a 7T2C structure. However, the 7T2C structure of the shift register of the prior art may have larger power consumption and occupy bigger space due to having a plurality of capacitors. Therefore, the 7T2C structure of the shift register of the prior art is not applicable to an energy-saving and narrow-border display panel.

SUMMARY OF THE INVENTION

The present invention provides a gate driving circuit comprising plural-stage shift registers, an Nth stage shift register of the plural-stage shift registers comprising a pull-up unit electrically connected to a gate line, for pulling up an Nth stage gate signal of the gate line to a high level voltage according to a driving voltage and a first clock signal; an energy-store unit electrically connected to the pull-up unit, for providing the driving voltage to the pull-up unit; a driving unit, electrically connected to the pull-up unit and the energy-store unit, for charging the energy-store unit according to a previous stage gate signal; a pull-down unit electrically connected to the energy-store unit and the gate line, for pulling down the driving voltage and the Nth stage gate signal to a low level voltage according to a control signal; and a control unit electrically connected to the pull-down unit for generating the control signal according to a second clock signal and the driving voltage; wherein N is an integer, the high level voltage is higher than the low level voltage, the first clock signal and the second clock signal have a same pulse width, and a rising edge of the first clock signal leads a rising edge of the second clock signal by ¼ to ½ pulse width.

In contrast to the prior art, the shift register of the gate driving circuit of the present invention consists of seven transistors and one capacitor (7T1C structure). The shift register of the present invention only comprises one single capacitor for reducing power consumption and saving space. Therefore, the gate driving circuit of the present invention is applicable to an energy-saving and narrow-border display panel.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
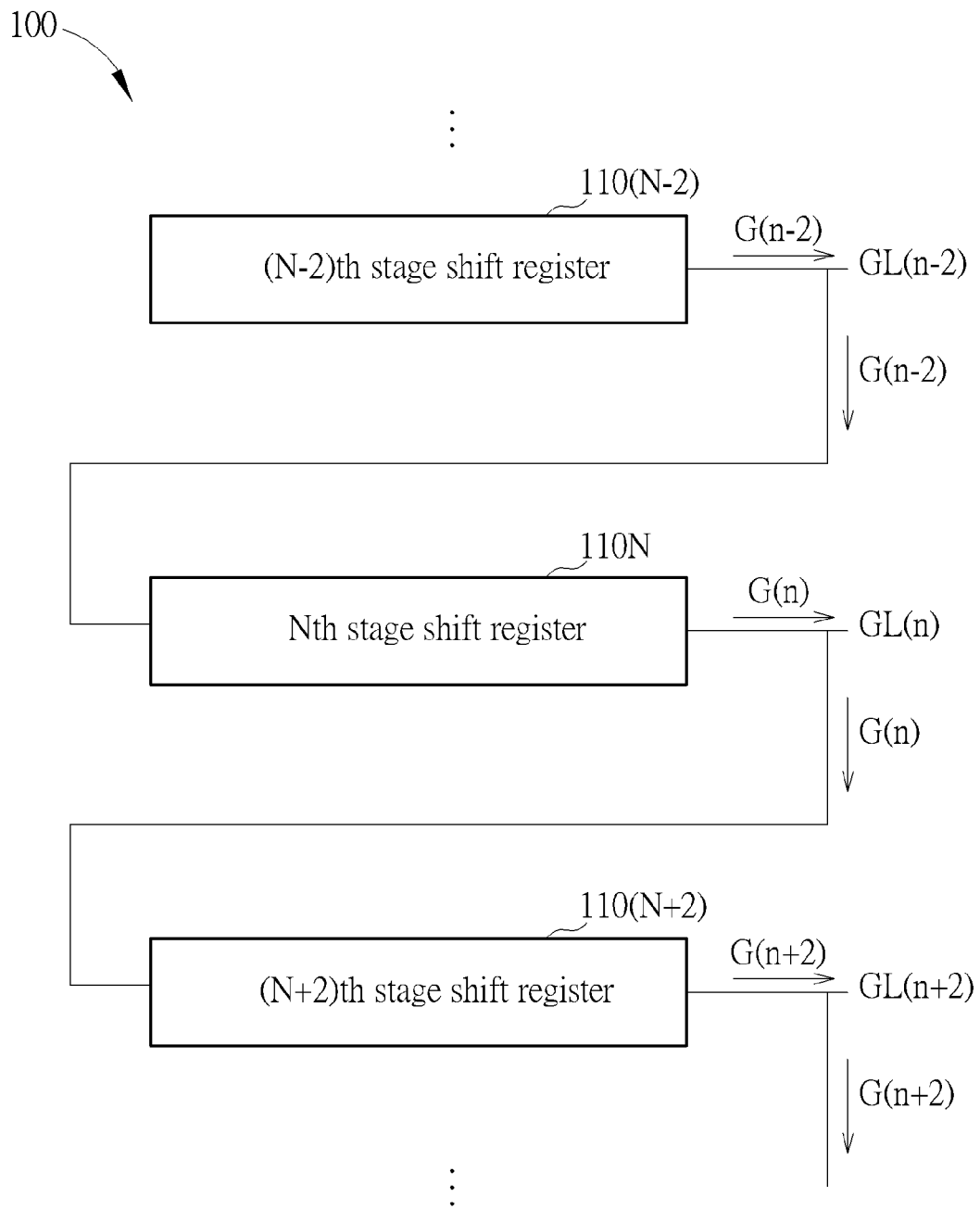
FIG. 1 is a diagram showing a gate driving circuit of the present invention.
Figure 2:
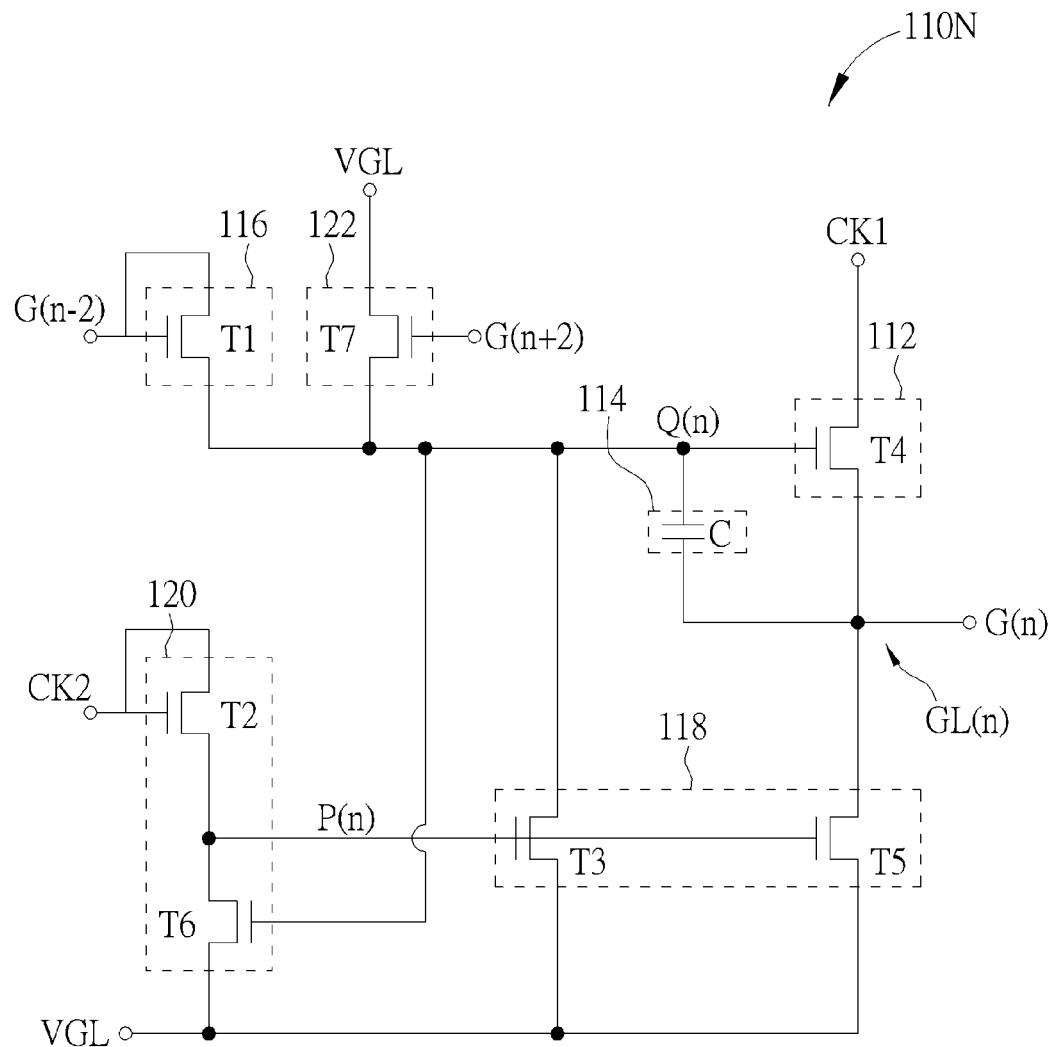
FIG. 2 is a diagram showing a first embodiment of an Nth stage shift register of the gate driving circuit of FIG. 1.

Please refer to FIG. 1 and FIG. 2. FIG. 1 is a diagram showing a gate driving circuit of the present invention. FIG. 2 is a diagram showing a first embodiment of an Nth stage shift register of the gate driving circuit of FIG. 1. As shown in figures, the gate driving circuit 100 comprises plural-stage shift registers 110. For ease of explanation, the gate driving circuit only illustrates an (N−2)th stage shift register 110 (N−2), an Nth stage shift register 110N, and an (N+2)th stage shift register 110 (N+2), wherein only an internal structure of the Nth stage shift register 110N is illustrated in FIG. 2. The other shift registers are similar to the Nth stage shift register 110N, thus, no further illustration is provided. The (N−2)th stage shift register 110(N−2) is for outputting a (N−2)th stage gate signal G(n−2). The Nth stage shift register 110N is for outputting an Nth stage gate signal G(n). The (N+2)th stage shift register 110 (N+2) is for outputting a (N+2)th stage gate signal G(n+2). The gate signals G(n−2), G(n), G(n+2) are sequentially transmitted to a pixel array via gate lines GL (n−2), GL(n), GL(n+2), in order to turn on corresponding pixel units. In addition, the gate signal G(n−2) is transmitted to the Nth stage shift register 110N in order to enable the Nth stage shift register 110N; and the gate signal G(n) is transmitted to the (N+2)th stage shift register 110(N+2) in order to enable the (N+2)th stage shift register 110 (N+2), wherein N is an integer.

The Nth stage shift register 110N comprises a pull-up unit 112, an energy-store unit 114, a driving unit 116, a pull-down unit 118 and a control unit 120. The pull-up unit 112 is electrically connected to the gate line GL (n), for pulling up the Nth stage gate signal G(n) of the gate line GL (n) to a high level voltage according to a driving voltage Q(n) and a first clock signal CK1. The energy-store unit 114 is electrically connected to the pull-up unit 112, for providing the driving voltage Q(n) to the pull-up unit 112. The driving unit 116 is electrically connected to the pull-up unit 112 and the energy-store unit 114, for charging the energy-store unit 114 according to the (N−2)th stage gate signal G (n−2) (or other previous stage gate signal). The pull-down unit 118 is electrically connected to the energy-store unit 114 and the gate line GL (n), for pulling down the driving voltage Q(n) and the Nth stage gate signal G(n) to a low level voltage VGL according to a control signal P (n). The control unit 120 is electrically connected to the pull-down unit 118, for generating the control signal P (n) according to a second clock signal CK2 and the driving voltage Q(n).

The Nth stage shift register 110N further comprises an auxiliary pull-down unit 122 electrically connected to the energy-store unit 114, for pulling down the driving voltage Q(n) according to the (N+2)th gate signal G(n+2) (or other subsequent stage gate signal).

In the embodiment of the present invention, the pull-up unit 112 comprises a pull-up transistor T4. A first end of the pull-up transistor T4 is configured to receive the first clock signal CK1, a control end of the pull-up transistor T4 is electrically connected to the energy-store unit 114 for receiving the driving voltage Q(n), and a second end of the pull-up transistor T4 is electrically connected to the gate line GL (n). The driving unit 116 comprises a driving transistor T1. A first end and a control end of the driving transistor T1 are configured to receive the (N−2)th stage gate signalG (n−2), and a second end of the driving transistor T1 is electrically connected to the energy-store unit 114.

The pull-down unit 118 comprises a first pull-down transistor T3 and a second pull-down transistor T5. A first end of the first pull-down transistor T3 is electrically connected to the energy-store unit 114, a control end of the first pull-down transistor T3 is electrically connected to the control unit 120 for receiving the control signal P(n), and a second end of the first pull-down transistor T3 is electrically connected to the low level voltage VGL. A first end of the second pull-down transistor T5 is electrically connected to the gate line GL(n), a control end of the second pull-down transistor T5 is electrically connected to the control unit 120 for receiving the control signal P(n), and a second end of the second pull-down transistor T5 is electrically connected to the low level voltage VGL.

The control unit 120 comprises a first control transistor T2 and a second control transistor T6. A first end and a control end of the first control transistor T2 are configured to receive the second clock signal CK2, and a second end of the first control transistor T2 is electrically connected to the pull-down unit 118. A first end of the second control transistor T6 is electrically connected to the second end of the first control transistor T2, a control end of the second control transistor T6 is electrically connected to the energy-store unit 114 for receiving the driving voltage Q(n), and a second end of the second control transistor T6 is electrically connected to the low level voltage VGL.

The energy-store unit 114 comprises a capacitor C. A first end of the capacitor C is electrically connected to the driving unit 116 and the pull-up unit 112, and a second end of the capacitor C is electrically connected to the gate line GL(n).

The auxiliary pull-down unit 122 comprises an auxiliary pull-down transistor T7. A first end of the auxiliary pull-down transistor T7 is configured to receive the low level voltage VGL, a control end of the auxiliary pull-down transistor T7 is configured to receive the (N+2)th stage gate signal G(n+2), and a second end of the auxiliary pull-down transistor T7 is electrically connected to the energy-store unit 114.

Figure 3:
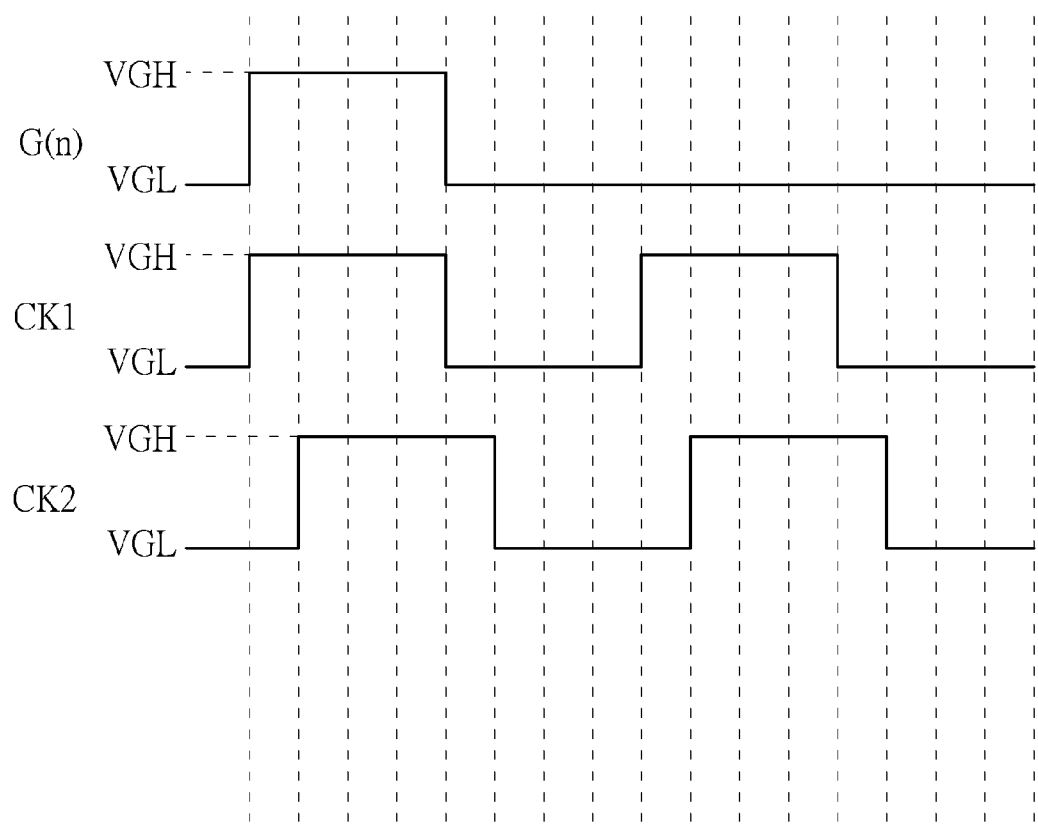
FIG. 3 is a diagram showing a first embodiment of waveforms of related signals of the Nth stage shift register.

Please refer to FIG. 3, and refer to FIG. 1 and FIG. 2 as well. FIG. 3 is a diagram showing a first embodiment of waveforms of related signals of the Nth stage shift register. As shown in FIG. 3, the first clock signal CK1 and the second clock signal CK2 have a same pulse width, and a rising edge of the first clock signal CK1 leads a rising edge of the second clock signal CK2 by ¼ pulse width. When the driving unit 116 receives the (N−2)th stage gate signal G(n−2) pulled up to the high level voltage, the driving unit 116 charges the energy-store unit 114, such that the driving voltage Q(n) is pulled up. When the first clock signal CK1 is raised to a high level voltage VGH, the driving voltage Q(n) of the energy-store unit 114 is further pulled up due to the capacitive coupling effect. Moreover, the pull-up unit 112 also pulls up the Nth stage gate signal G(n) to the high level voltage VGH when the first clock signal CK1 is raised to the high level voltage VGH. The high level voltage VGH is higher than the low level voltage VGL. When the second clock signal CK2 is also raised to the high level voltage VGH, the second clock signal CK2 pre-charges the first control transistor T2, but since the driving voltage Q(n) has a higher voltage level, the second control transistor T6 is also turned on for keeping the control signal P(n) at the low level voltage VGL. When the first clock signal CK1 is dropped to the low level voltage VGL and the second clock signal CK2 is still at the high level voltage VGH, the Nth stage gate signal G(n) is pulled down to the low level voltage VGL, and the driving voltage Q(n) is further pulled down due to the capacitive coupling effect, such that the second control transistor T6 is turned off, so as to pull up the control signal P(n) of the control unit 120 to the high level voltage VGH. When the control signal P(n) is pulled up to the high level voltage VGH, the first pull-down transistor T3 and the second pull-down transistor T5 of the pull-down unit 118 are turned on by the control signal P(n), in order to further pull down the driving voltage Q(n) and the Nth stage gate signal G(n) to the low level voltage VGL.

In addition, the auxiliary pull-down unit 122 can pull down the driving voltage Q(n) again when receiving the (N+2)th stage gate signal G(n+2) pulled up to the high level voltage, in order to keep stability of the Nth stage shift register.

According to the above arrangement, the driving voltage and the control signal of the shift register can be stably generated without mutually suppressing, therefore, the shift register of the gate driving circuit of the present invention can output the gate signals stably. Moreover, the shift register of the gate driving circuit of the present invention consists of seven transistors and one capacitor, which is a 7T1C structure. The 7T1C structure of the shift register of the present invention only comprises one single capacitor, such that the shift register of the present invention can reduce power consumption and save space.

Figure 4:
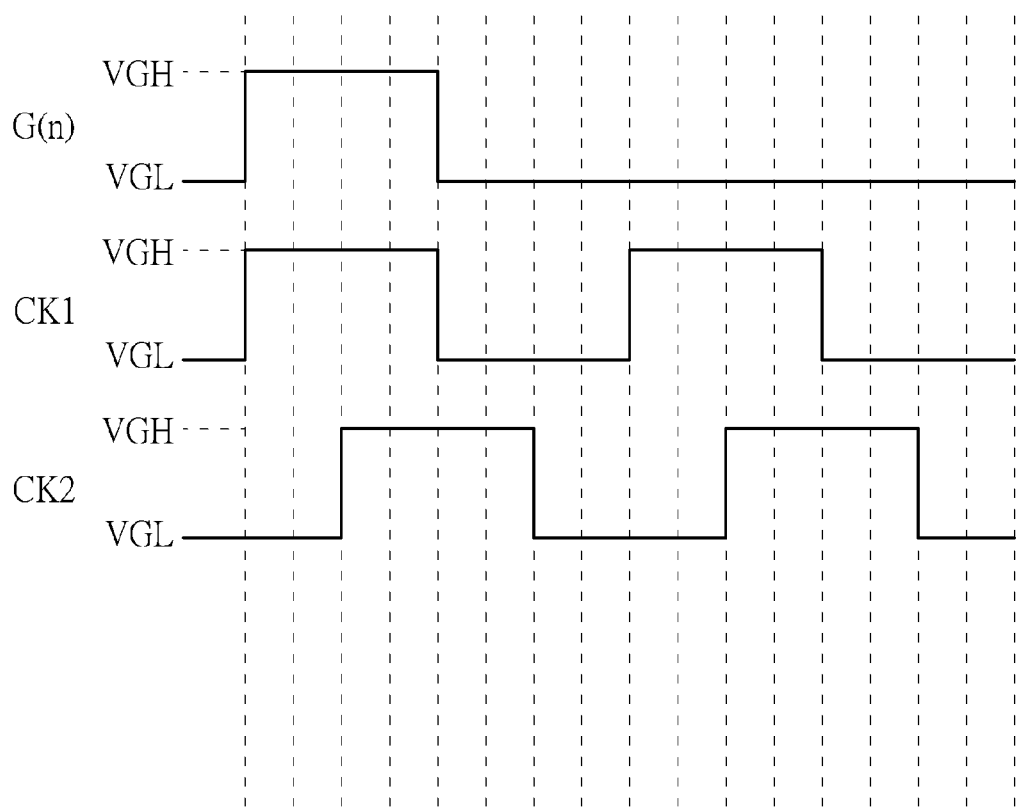
FIG. 4 is a diagram showing a second embodiment of waveforms of related signals of the Nth stage shift register.

Please refer to FIG. 4, and refer to FIG. 1 and FIG. 2 as well. FIG. 4 is a diagram showing a second embodiment of waveforms of related signals of the Nth stage shift register. As shown in FIG. 4, the first clock signal CK1 and the second clock signal CK2 have the same pulse width, and the rising edge of the first clock signal CK1 leads the rising edge of the second clock signal CK2 by ½ pulse width. Operations of the Nth stage shift register in FIG. 4 is similar to the above illustration, thus no further explanation is provided. In the embodiments of the present invention, the rising edge of the first clock signal CK1 leads the rising edge of the second clock signal CK2 by ¼ to ½ pulse width.

Figure 5:
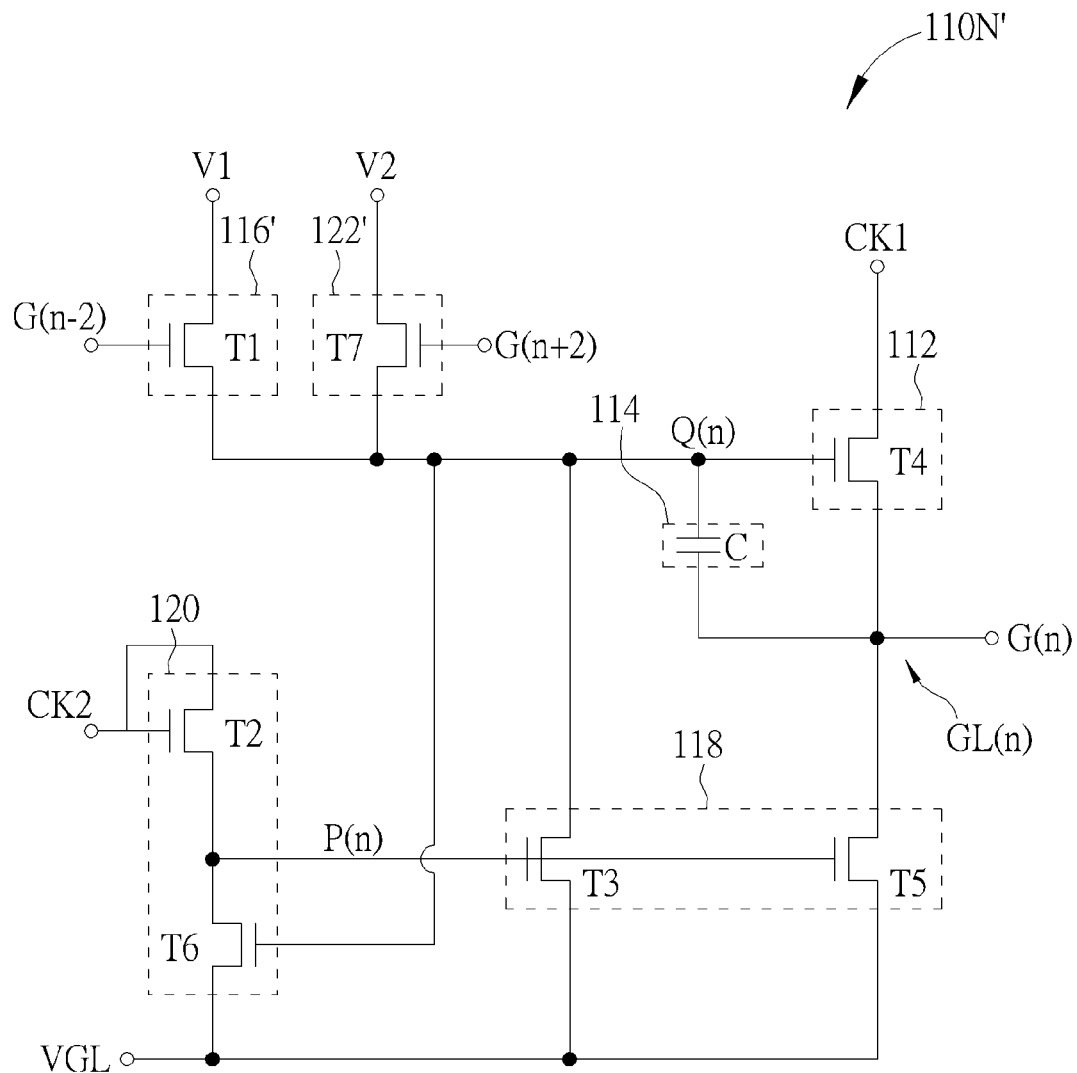
FIG. 5 is a diagram showing a second embodiment of the Nth stage shift register of the gate driving circuit of FIG. 1.

Please refer to FIG. 5. FIG. 5 is a diagram showing a second embodiment of the Nth stage shift register of the gate driving circuit of FIG. 1. Besides driving unit 116' and auxiliary pull-down unit 122' in FIG. 5, other components of the Nth stage shift register 110N' are identical to the components of the Nth stage shift register 110N in FIG. 2. The driving unit 116' comprises a driving transistor T1. A first end of the driving transistor T1 is configured to receive a high level voltage V1, a control end of the driving transistor T1 is configured to receive the (N−2)th stage gate signal G(n−2), and a second end of the driving transistor T1 is electrically connected to the energy-store unit 114. The auxiliary pull-down unit 122' comprises an auxiliary pull-down transistor T7. A first end of the auxiliary pull-down transistor T7 is configured to receive a low level voltage V2, a control end of the auxiliary pull-down transistor T7 is configured to receive the (N+2)th stage gate signal G(n+2), and a second end of the auxiliary pull-down transistor T7 is electrically connected to the energy-store unit 114. The high level voltage V1 can be equal to or different from the high level voltage VGH, and the low level voltage V2 can be equal to or different from the low level voltage VGL. According to the above arrangement, when the driving unit 116' receives the (N−2)th stage gate signal G(n−2) pulled up to the high level voltage VGH, the driving transistor T1 is turned on for charging the energy-store unit 114 by the high level voltage V1; and when the auxiliary pull-down unit 122' receives the (N+2)th stage gate signal G(n+2) pulled up to the high level voltage VGH, the auxiliary pull-down transistor T7 is turned on for pulling down the driving voltage Q(n) by the low level voltage V2. Operations of the Nth stage shift register 110N' in FIG. 5 is similar to operations of the Nth stage shift register 110N in FIG. 2, thus no further explanation is provided.

Figure 6:
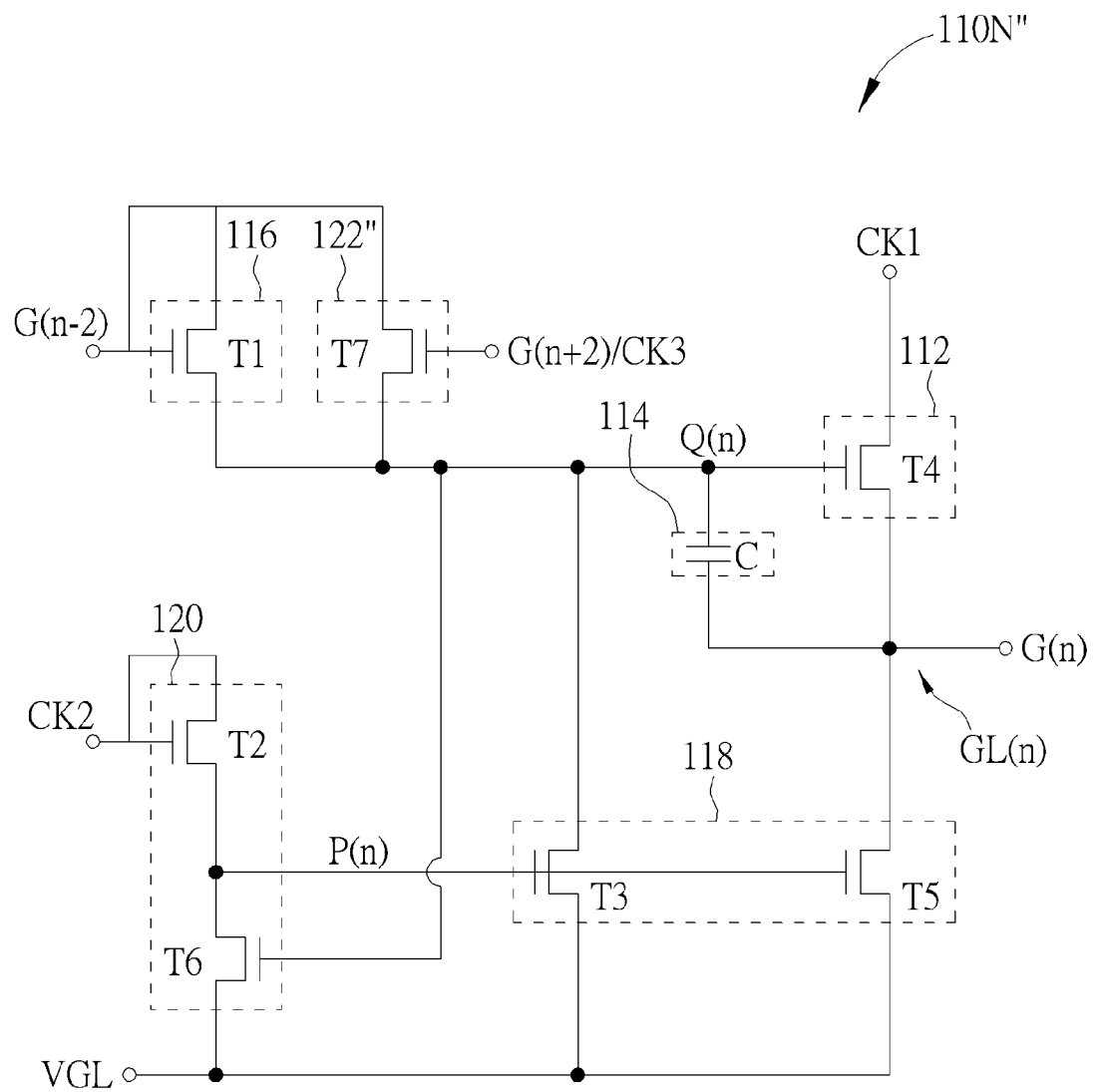
FIG. 6 is a diagram showing a third embodiment of the Nth stage shift register of the gate driving circuit of FIG. 1.

Please refer to FIG. 6. FIG. 6 is a diagram showing a third embodiment of the Nth stage shift register of the gate driving circuit of FIG. 1. Besides auxiliary pull-down unit 122" in FIG. 6, other components of the Nth stage shift register 110N" are identical to the components of the Nth stage shift register 110N in FIG. 2. The auxiliary pull-down unit 122" comprises an auxiliary pull-down transistor T7. A first end of the auxiliary pull-down transistor T7 is configured to receive the (N−2)th stage gate signal G(n−2), a control end of the auxiliary pull-down transistor T7 is configured to receive the (N+2)th stage gate signal G(n+2) or a third clock signal CK3, and a second end of the auxiliary pull-down transistor T7 is electrically connected to the energy-store unit 114. A phase of the third clock signal CK3 is opposite to a phase of the first clock signal CK1. According to the above arrangement, when the auxiliary pull-down unit 122" receives the (N+2)th stage gate signal G(n+2) pulled up to the high level voltage VGH or when the third clock signal CK3 is raised, the auxiliary pull-down transistor T7 is turned on for pulling down the driving voltage Q(n) by the (N−2)th stage gate signal G(n−2), which is pulled down to the low level voltage VGL. Operations of the Nth stage shift register 110N" in FIG. 6 is similar to operations of the Nth stage shift register 110N in FIG. 2, thus no further explanation is provided.

The gate driving circuit of the present invention can be directly formed on a border area of a display panel, in other words, the gate driving circuit of the present invention is applicable to a gate-in-panel type display panel.

In addition, in the above embodiments, the gate driving circuit is utilized for bidirectional driving, thus the Nth stage shift register 110N is driven by the gate signal G(n−2) of the (N−2)th stage shift register 110 (N−2). However, the present invention is not limited by the above embodiments. In other embodiments of the present invention, the Nth stage shift register 110N can be driven by a gate signal of other previous stage shift register.

In contrast to the prior art, the shift register of the gate driving circuit of the present invention consists of seven transistors and one capacitor (7T1C structure). The shift register of the present invention only comprises one single capacitor for reducing power consumption and saving space. Therefore, the gate driving circuit of the present invention is applicable to an energy-saving and narrow-border display panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate driving circuit, comprising plural-stage shift registers, an Nth stage shift register of the plural-stage shift registers comprising:
   a pull-up unit electrically connected to a gate line, for pulling up an Nth stage gate signal of the gate line to a high level voltage according to a driving voltage and a first clock signal;
   an energy-store unit electrically connected to the pull-up unit, for providing the driving voltage to the pull-up unit;
   a driving unit, electrically connected to the pull-up unit and the energy-store unit, for charging the energy-store unit according to a previous stage gate signal;
   a pull-down unit electrically connected to the energy-store unit and the gate line, for pulling down the driving voltage and the Nth stage gate signal to a low level voltage according to a control signal; and
   a control unit electrically connected to the pull-down unit for generating the control signal according to a second clock signal and the driving voltage;
   wherein N is an integer, the high level voltage is higher than the low level voltage, the first clock signal and the second clock signal have a same pulse width, and a rising edge of the first clock signal leads a rising edge of the second clock signal by ¼ to ½ pulse width.

2. The gate driving circuit of claim 1 further comprising an auxiliary pull-down unit electrically connected to the energy-store unit, for pulling down the driving voltage according to a subsequent stage gate signal.

3. The gate driving circuit of claim 2, wherein the subsequent stage gate signal is a (N+2)th stage gate signal.

4. The gate driving circuit of claim 2, wherein the auxiliary pull-down unit comprises:
   an auxiliary pull-down transistor, comprising:
      a first end for receiving the low level voltage;
      a control end for receiving the subsequent stage gate signal; and
      a second end electrically connected to the energy-store unit.

5. The gate driving circuit of claim 1, wherein the previous stage gate signal is a (N−2)th stage gate signal.

6. The gate driving circuit of claim 1, wherein the pull-up unit comprises:
   a pull-up transistor, comprising:
      a first end for receiving the first clock signal;
      a control end electrically connected to the energy-store unit for receiving the driving voltage; and
      a second end electrically connected to the gate line.

7. The gate driving circuit of claim 1, wherein the driving unit comprises:
   a driving transistor, comprising:
      a first end for receiving the previous stage gate signal;
      a control end for receiving the previous stage gate signal; and
      a second end electrically connected to the energy-store unit.

8. The gate driving circuit of claim 1, wherein the pull-down unit comprises:
   a first pull-down transistor, comprising:
      a first end electrically connected to the energy-store unit;
      a control end electrically connected to the control unit for receiving the control signal; and
      a second end electrically connected to the low level voltage; and
   a second pull-down transistor, comprising:
      a first end electrically connected to the gate line;
      a control end electrically connected to the control unit for receiving the control signal; and
      a second end electrically connected to the low level voltage.

9. The gate driving circuit of claim 1, wherein the control unit comprises:
   a first control transistor, comprising:
      a first end for receiving the second clock signal;
      a control end for receiving the second clock signal; and
      a second end electrically connected to the pull-down unit; and a second control transistor, comprising:
- a first end electrically connected to the second end of the first control transistor;
- a control end electrically connected to the energy-store unit for receiving the driving voltage; and
- a second end electrically connected to the low level voltage.

10. The gate driving circuit of claim 1, wherein the energy-store unit comprises:

a capacitor, comprising:
- a first end electrically connected to the driving unit and the pull-up unit; and
- a second end electrically connected to the gate line.

* * * * *